United States Patent [19]

McGrath

[11] Patent Number: 4,816,918
[45] Date of Patent: Mar. 28, 1989

[54] SOLID STATE IMAGING DEVICE FOR PROVIDING LINE DECIMATED OUTPUT SIGNAL

[75] Inventor: R. Daniel McGrath, Andover, Mass.

[73] Assignee: Polaroid Corporation, Cambridge, Mass.

[21] Appl. No.: 101,015

[22] Filed: Sep. 25, 1987

[51] Int. Cl.$^4$ .............................................. H04N 5/335
[52] U.S. Cl. ........................... 358/213.23; 358/213.26
[58] Field of Search ....................... 358/213.27, 213.29, 358/213.26, 213.23

[56] References Cited

U.S. PATENT DOCUMENTS

| 4,127,877 | 11/1978 | Marishita et al. | 358/213 |
| 4,280,141 | 7/1981 | McCann et al. | 358/213 |
| 4,677,496 | 6/1987 | Miyazawa | 358/285 |

FOREIGN PATENT DOCUMENTS 164682 12/1981 Japan .
1405699 9/1975 United Kingdom .

OTHER PUBLICATIONS

U.S. Patent Application Ser. No. 074,773, entitled "Apparatus for Encoding and Decoding High Resolution Still Images and Video Images for Recording on a Standard Storage Media", by A. Green and D. Pape, Filed Jul. 16, 1987.

Primary Examiner—James J. Groody
Assistant Examiner—Robert M. Bauer
Attorney, Agent, or Firm—Edward S. Roman

[57] ABSTRACT

Apparatus and method for providing a select line decimated output signal from a charge domain imaging device by way of a shift register comprising a linear portion of serially connected image data holding elements connected at select elements along the length thereof, respectively, to groups of image data holding elements arranged in carousels.

17 Claims, 5 Drawing Sheets

SOLID STATE IMAGING DEVICE FOR PROVIDING LINE DECIMATED OUTPUT SIGNAL

BACKGROUND OF THE INVENTION

1. Field of the Invention

This invention relates generally to an apparatus and method for providing a select line decimated output signal and, more particularly, to an apparatus and method for selectively decimating the line output signal from an electronic image sensing device.

2. Description of the Prior Art

High resolution solid state image sensors such as charge-coupled devices (CCD), charge-injection detectors (CID), and so forth, are finding increasing use as imaging elements for cameras. Such high resolution image sensors produce a large number of pixels for each horizontal scan line of their output which may exceed 1,000 pixels.

In order for such high resolution solid state image sensors to be compatible with conventional TV video signal formats, each horizontal line scan of 1,000 or more pixels must be transferred in the time allowed for one conventional video line scan, 53.5 microseconds. However, in order to transfer electronic image signals for a 1,000 or more line scan, a bandwidth of over 10 MHz is required which far exceeds the capability of most conventional video recorders. Thus, at present in transferring the output of a high resolution sensor to a conventional video recorder, a high percentage of the image sensor output is typically lost as a result of the signal being constrained by the bandwidth limitations of the recording apparatus. As a consequence, a substantial amount of resolution is lost. One solution to solving the aforementioned problems is described in copending United States patent application Ser. No. 074,773, entitled "Apparatus for Encoding and Decoding High Resolution Still Images and Video Images for Recording on a Standard Storage Media", by A. Green and D. Pape, filed July 16, 1987. Green and Pape solve the aforementioned problem by dissecting each line of image data received from the image sensor into a plurality of interleaved subgroups, each subgroup of which may be transferred at a conventional video rate without loss of image resolution. Green and Pape, however, implement their line dissection with discrete circuitry separate and apart from the image sensor.

OBJECT OF THE INVENTION

Therefore, it is a primary object of this invention to provide a select line decimated output signal from a charge domain imaging device.

It is a further object of this invention to provide a novel line decimating shift register that can be integrated with image sensing and storing arrays on a single semiconductor substrate.

Other objects of the invention will be, in part, obvious and will, in part, appear hereinafter. The invention accordingly comprises a mechanism and system possessing the construction, combination of elements and arrangement of parts which are exemplified in the following detailed disclosure.

SUMMARY OF THE INVENTION

An apparatus and method for line decimating an output signal into a plurality of subsections wherein the output signal is received from a charge transfer imaging device of the type comprising an array of charge-packet creating photosensitive elements includes a novel shift register. The novel shift register comprises a first plurality of charge-packet holding elements connected in series relation with respect to each other and connectable in relation with respect to the array of charge-packet creating photosensitive elements so that each element of the first plurality of elements can store a charge packet received from a respective one of the elements of the array. The shift register also includes a second plurality of charge-packet holding elements divided into a select number of groups corresponding to the number of charge-packet holding elements in each subsection to which the output signal is line decimated. The charge-packet holding elements of each of the groups of the second plurality of charge-packet holding elements are serially connected with respect to each other. The charge-packet holding element at one end of each group of the serially connected second plurality of charge-packet holding elements connects, respectively, to a select charge-packet holding element of the first plurality of charge-packet holding elements. The charge-packet holding element at the other end of each group of the serially connected second plurality of charge-packet holding elements connects, respectively, to a select charge-packet holding element of the first plurality of charge-packet holding elements. The select charge-packet holding elements of the first plurality of charge-packet holding elements to which the end charge-packet holding elements of the second plurality of charge-packet holding elements connect is determined by the number of line decimations to be imparted to the output signal.

DESCRIPTION OF THE DRAWINGS

The novel features that are considered characteristic of the invention are set forth with particularity in the appended claims. The invention itself, however, both as to its organization and its method of operation, together with other objects and advantages thereof will be best understood from the following description of the illustrated embodiments when read in connection with the accompanying drawings wherein:

DESCRIPTION OF THE PREFERRED EMBODIMENT

Figure 1A:
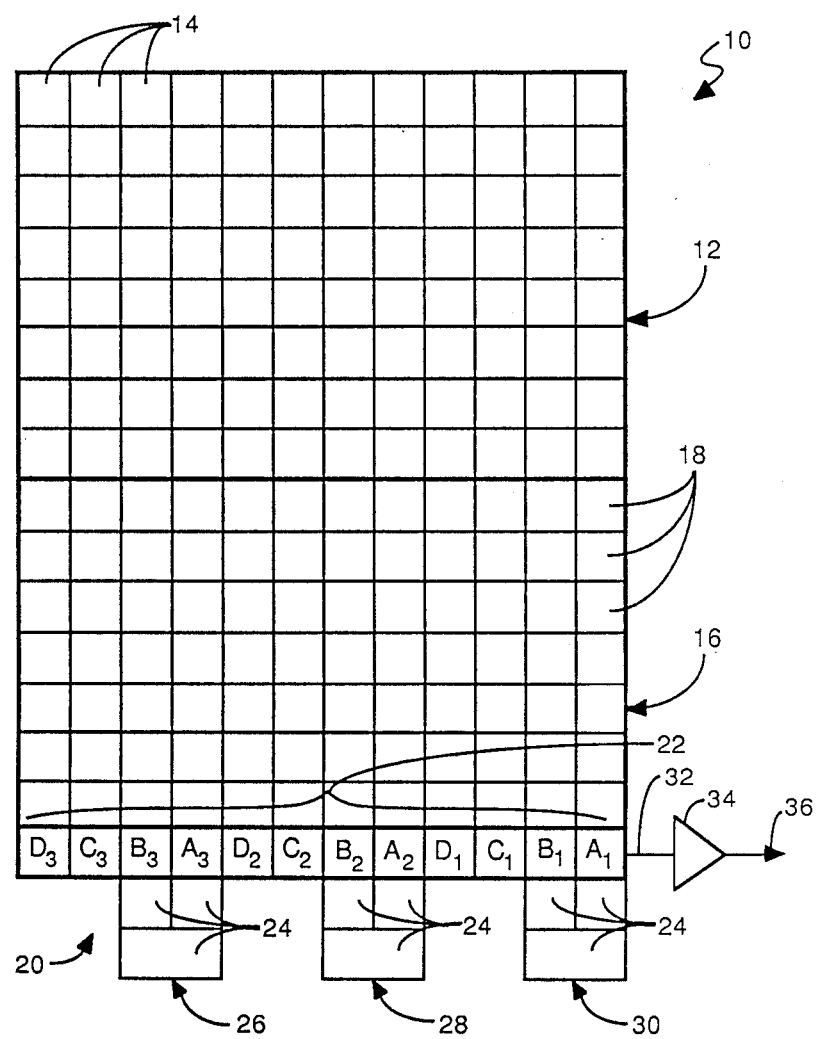
FIG. 1A is a schematic diagram of a charge transfer imaging device embodying the line decimating shift register of this invention.

Referring now to FIG. 1A, there is shown a schematic diagram for a charge-transfer imaging device embodying the line decimating shift register feature of this invention. The imaging device 10 of this invention includes an image sensing array 12 comprising a predetermined number of discrete image sensing elements or pixels 14 arranged in a two-dimensional array in which the image sensing elements 14 respond to incident illumination to create respective charge packets corresponding to the intensity of the incident illumination. An image storing array 16 comprises a predetermined number of discrete image storing elements 18 arranged in a two-dimensional array for receiving and storing the charge packets received directly from the image sensing array 12. The image sensing array 12 and the image storing array 16 may comprise either a CCD structure or any other well-known charge domain device of either the line or frame transfer type fabricated on a single semiconductor substrate. As is well known, the two-dimensional image sensing array 12 may be used to sense color images by filtering the illumination incident to the image sensing array so that different groups of the image sensing elements 14 arranged in well-known patterns across the image sensing array 12 receive different wavelengths or colored illumination.

A shift register for providing the select line decimated output signal in the manner of this invention as shown generally at 20 comprises a first plurality of charge-packet holding elements 22 connected in serial relation with respect to each other. A second plurality of charge-packet holding elements 24 is divided into a select number of groups 26, 28 and 30 corresponding to the number of charge-packet holding elements in each subsection to which the output signal is decimated in the manner of this invention. The charge-packet holding elements 24 of each of the groups 26, 28 and 30 are also serially connected with respect to each other in a carousel arrangement with the charge-packet holding elements at both ends of each group connecting, respectively, to selected ones of the charge-packet holding elements 22. As will become readily apparent, the select elements of the first plurality of charge-packet holding elements 22 to which the end elements of the second plurality of charge-packet holding elements 24 of the carousel groups 26, 28 and 30 connect are determined in accordance with the number of line decimations to be imparted to the output signal.

Operation of the aforementioned image sensing array 12 and image storing array 16 proceeds in the usual manner with charge packets from all the columns of the image storing array 16 thereafter being loaded into the first plurality of charge-packet holding elements 22 as shown in FIG. 1A. During the loading of the charge-packet holding elements 22, the control gates for the charge-packet holding elements 24 in the carousel groups 26, 28 and 30 are all turned off so as to prohibit charge packets from initially entering the carousel groups. For the example herein illustrated, the output signal will be decimated into four subsections comprising, respectively, charge packets A, B, C and D. As is readily apparent, each of the charge packets A, B, C or D may correspond to a specific color or wavelength of illumination incident to the corresponding charge-packet creating elements of the image sensing array 12. However, as will be readily understood, the line decimation function of this invention is not limited to creating subsections which correspond to different color incident illumination but may also be used for maintaining the data flow rates within the frequency limitations of a conventional recording system in order to maintain high resolution output images as previously discussed.

Figure 1B:
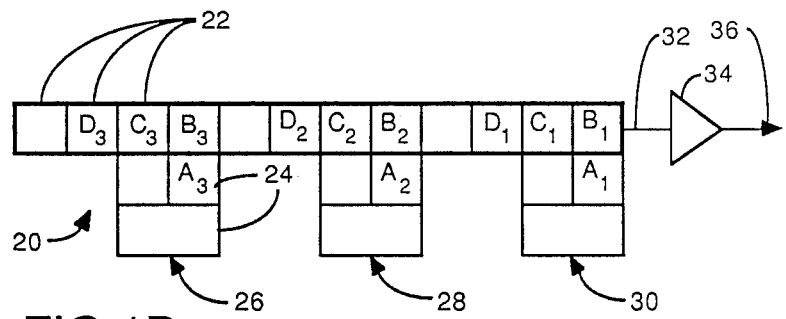
FIG. 1B is a schematic diagram for the line decimating shift register of FIG. 1A in a succeeding mode of operation from that as shown in FIG. 1A.

Once the first plurality of charge-packet holding elements 22 has been loaded in the aforementioned manner, the control gates for the carousel groups 26, 28 and 30 are simultaneously clocked to transfer the leading charge packets $A_1$, $A_2$ and $A_3$ from one of the four subsections to which the line is to be decimated into the corresponding adjacent ones of the second plurality of charge-packet holding elements 24 as shown in FIG. 1B.

Figure 1C:
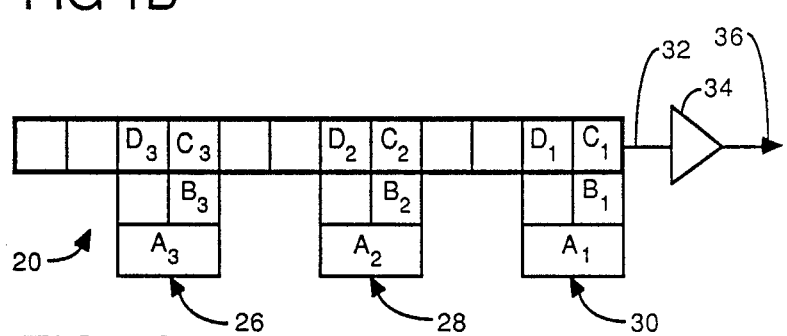
FIG. 1C is a schematic diagram of the line decimating shift register of FIG. 1A in a succeeding mode of operation from that of FIG. 1B.

The clocking continues to advance the charge packets $A_1$, $A_2$ and $A_3$ to the next succeeding ones of the second plurality of charge-packet holding elements 24 in the respective carousel groups 26, 28 and 30 as shown in FIG. 1C. Simultaneous to the advancement of the charge packets $A_1$, $A_2$ and $A_3$ in the respective carousel groups 26, 28 and 30, the charge packets $B_1$, $B_2$ and $B_3$ are simultaneously advanced from the first plurality of charge-packet holding elements 22 to respective ones of the second plurality of charge-packet holding elements 24 previously occupied by the charge packets $A_1$, $A_2$ and $A_3$, as shown in FIG. 1C.

Figure 1D:
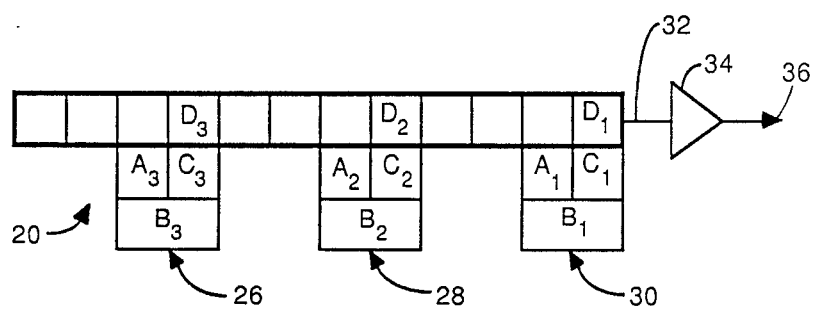
FIG. 1D is a schematic diagram of the line decimating shift register of FIG. 1A in a succeeding mode of operation from that of FIG. 1C.

As shown in FIG. 1D, the clocking continues so as to simultaneously advance the charge packets $A_1$, $A_2$ and $A_3$ to the positions as shown in FIG. 1D. The charge packets $B_1$, $B_2$ and $B_3$ are also simultaneously advanced to the respective ones of the second plurality of charge-packet holding elements 24 previously occupied by the charge packets $A_1$, $A_2$ and $A_3$, respectively. The charge packets $C_1$, $C_2$ and $C_3$ are also simultaneously advanced from the first plurality of charge-packet holding elements 22 into respective ones of the second plurality of charge-packet holding elements 24 previously occupied by the charge packets $B_1$, $B_2$ and $B_3$, respectively.

Figure 1E:
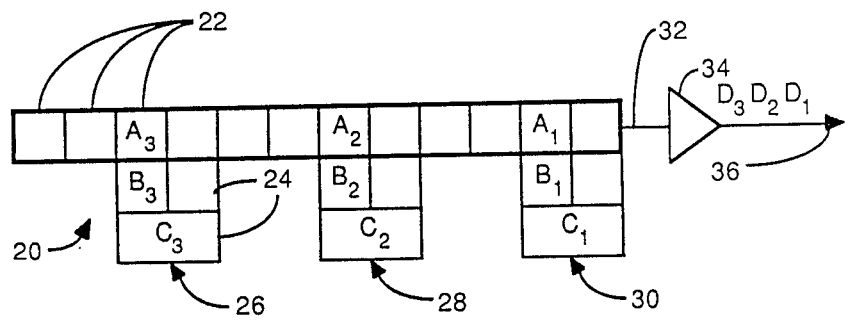
FIG. 1E is a schematic diagram for the line decimating shift register of FIG. 1A in a succeeding mode of operation from that of FIG. 1D.

As is now readily apparent, the first plurality of charge-packet holding elements 22 contains only the charge packets $D_1$, $D_2$ and $D_3$ which are subsequently clocked out by way of an output line 32, an amplifier 34 and an output terminal 36 as shown in FIG. 1E to provide the first subsection of charge packets to which the output signal is line decimated. After the charge packets $D_1$, $D_2$ and $D_3$ are clocked out, charge packets $A_1$, $A_2$ and $A_3$ are advanced into respective ones of the first plurality of charge-packet holding elements 22 as shown in FIG. 1E. Simultaneous to this the charge packets $B_1$, $B_2$ and $B_3$ are advanced to respective ones of the second plurality of charge-packet holding elements 24 previously occupied by the charge packets $A_1$, $A_2$ and $A_3$. In like manner, the charge packets $C_1$, $C_2$ and $C_3$ are also advanced to respective ones of the second plurality of charge-packet holding elements 24 previously occupied by the charge packets $B_1$, $B_2$ and $B_3$ as also shown in FIG. 1E.

Figure 1F:
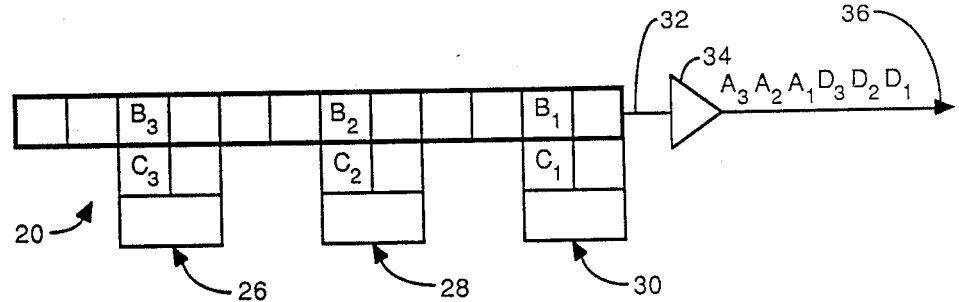
FIG. 1F is a schematic diagram of the line decimating shift register of FIG. 1A in a succeeding mode of operation to that of FIG. 1E.

The charge packets $A_1$, $A_2$ and $A_3$ are thereafter gated out of the first plurality of charge-packet holding elements 22 by way of the output line 32, amplifier 34 and output terminal 36 as shown in FIG. 1F to provide the second subsection of charge packets to which the output signal is line decimated. Charge packets $B_1$, $B_2$ and $B_3$ are next simultaneously gated into respective ones of the first plurality of charge-packet holding elements 22 previously occupied by respective ones of the charge packets $A_1$, $A_2$ and $A_3$ as shown in FIG. 1F. In like manner, the charge packets $C_1$, $C_2$ and $C_3$ are gated to the respective ones of the second plurality of charge-packet holding elements 24 previously occupied by respective ones of the charge packets $B_1$, $B_2$ and $B_3$.

Figure 1G:
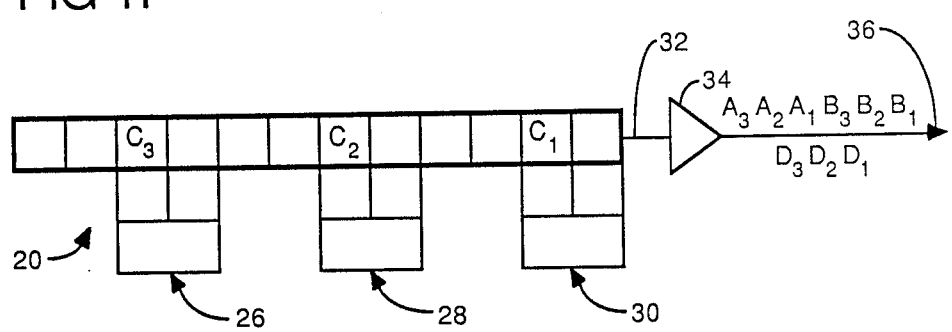
FIG. 1G is a schematic diagram for the line decimating shift register of FIG. 1A in a succeeding mode of operation to that of FIG. 1F.

The charge packets $B_1$, $B_2$ and $B_3$ are thereafter gated out of the first plurality of charge-packet holding elements 22 by way of the output line 32, amplifier 34 and output terminal 36 as shown in FIG. 1G to provide the third subsection of charge packets to which the output signal is line decimated. The charge packets $C_1$, $C_2$ and $C_3$ are thereafter gated into respective ones of the first plurality of charge packet holding elements 22 previously occupied by the charge packets $B_1$, $B_2$ and $B_3$ as shown in FIG. 1G. In the last step, the charge packets $C_1$, $C_2$ and $C_3$ are gated out of the first plurality of the charge-packet holding elements 24 to provide the fourth and last dissected subsection of charge packets.

As is now readily apparent, the output signal for each line of image data is dissected into four subsections A, B, C and D, each of which may correspond to a particular color or wavelength of incident illumination. It should also be readily apparent that in the case where N line decimations of M charge-packet holding elements each are to be provided, the number of carousel groups of charge-packet holding elements required is M with each carousel group of charge-packet holding elements connecting to the $n^{th}$ charge-packet holding element of the first plurality of serially connected charge-packet holding elements 22. In addition, each carousel group preferably comprises N—1 charge-packet holding elements. The charge-packet holding elements from which the charge packets enter and exit the carousel groups 26, 28 and 30 may connect, respectively, to adjacent charge-packet holding elements of the first plurality of serially connected charge-packet holding elements 22 as shown in FIGS. 1A–1G or, alternatively, may connect, respectively, to the same charge-packet holding element of the first plurality of charge-packet holding elements as shown in FIG. 2A to be subsequently described herein.

Figure 2A:
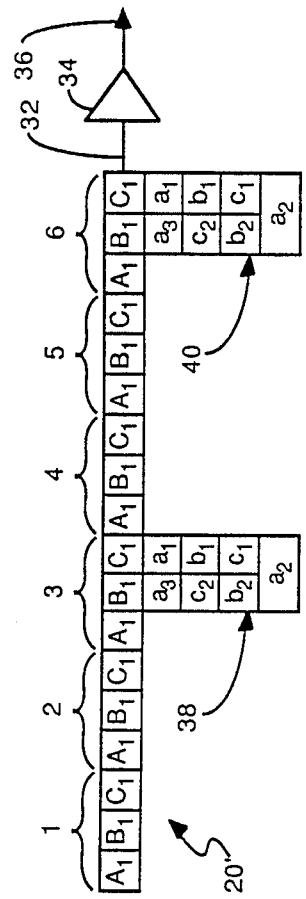
FIG. 2A is a schematic diagram for an alternate embodiment of the line decimating shift register of FIG. 1A.
Figure 2B:
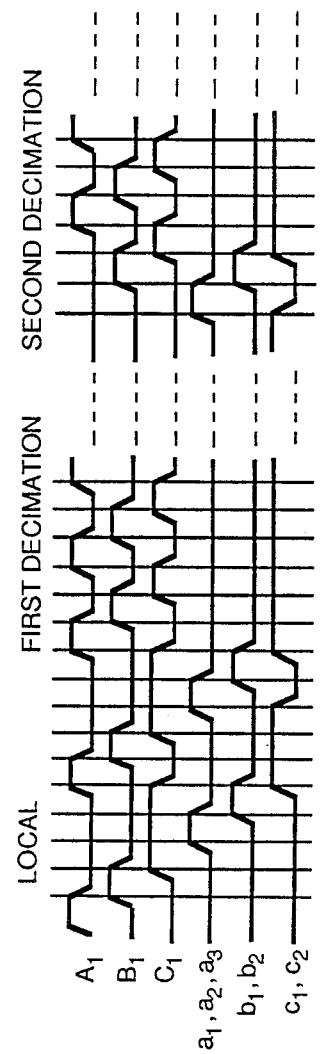
FIG. 2B is a timing diagram showing the gate control clocking signals for the shift register of FIG. 2A.

Referring now to FIG. 2A where like numerals designate previously-described elements, there is shown at 20' an alternate arrangement for a three-phase line decimating shift register. The three-phase line decimating shift register 20' comprises a first plurality of charge-packet holding elements 1–6. Each of the first plurality of charge-packet holding elements 1–6 includes three control gates each controlling one of the phases A, B and C. Thus, in a manner as is well known in the art, by appropriately sequencing the gate control voltages a charge packet in each of the charge-packet holding elements 1–6 is sequentially gated through the phases A, B and C. For this example three line decimations are to be imparted to the output signal. Two carousel groups 38 and 40 are provided with each group comprising two three-phase charge-packet holding elements $a_1$, $b_1$, $c_1$ and $a_2$, $b_2$ and $c_2$ and one phase of a third charge-packet holding element $a_3$. As will be readily understood, charge packets in the charge-packet holding phase $a_3$ are subsequently gated by way of the charge-packet holding phases $B_1$ and $C_1$ in the charge-packet holding elements 3 and 6, respectively. The gate control clock signals for advancing the charge packets from phase to phase within the individual charge-packet holding elements and between succeeding charge-packet holding elements are shown in FIG. 2B. As will be well understood, the timing diagram of FIG. 2B requires different clocking voltages between the a and b phases in comparison to the A and B phases or a different threshold adjustment between these phases. The line decimating shift register of this invention is also applicable to higher multiple phases than those illustrated as well as single phase.

Figure 3A:
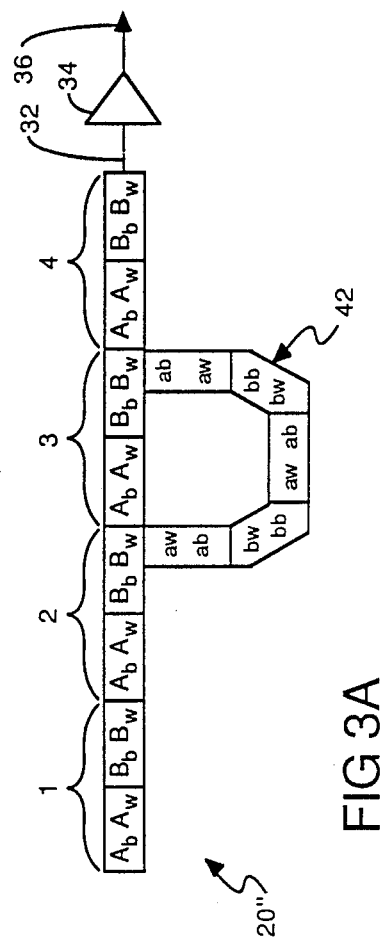
FIG. 3A is a schematic diagram for still another embodiment of the line decimating shift register of FIG. 1A.
Figure 3B:
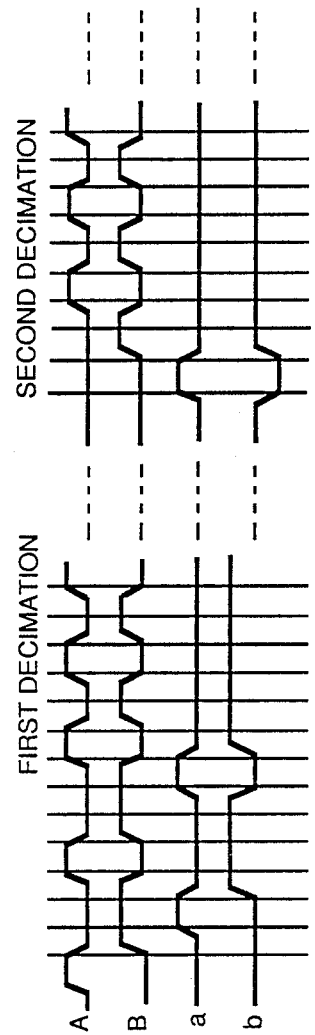
FIG. 3B is a timing diagram showing the gate control clocking signals for the shift register of FIG. 3A.

Referring now to FIG. 3A where like numerals designate previously described elements, there is shown at 20" an alternate arrangement for the line decimating shift register of this invention comprising a first plurality of charge-packet holding elements 1–4. Each of the charge-packet holding elements 1–4 has two phases A and B controlled by respective gates. As will be readily understood, each gate controls a barrier and well region and therefore the subscript b and w designate barrier and well, respectively. A carousel group as shown at 42 comprises two charge-packet holding elements of two (a and b) phases each together with one phase (a) of a third charge-packet holding element. Referring now to FIG. 3B, there are shown the gate control clock signals applied to the corresponding phases of the charge-packet holding elements to achieve a two line decimation for the arrangement of FIG. 3. Again, as is well understood, the timing shown require different clocking voltages between the a and b phases in comparison to the A and B phases or a different threshold adjustment between these phases.

The structure for a single phase device is substantially the same as the aforementioned structure described for the two phase device except instead of two control gates, only a single control gate operates to control the transfer of charge packets through two phases. The (B) and (b) phases are held at a DC level by gates formed by any well-known doping technique in the silicon.

Although the line decimating shift register of this invention has been shown in conjunction with a two-dimensional image sensing array, it will also be readily apparent that the invention will be equally useful with a linear one-dimensional image sensing array. Also, as should be readily apparent, the line decimating shift register of this invention is preferably fabricated on the same semiconductor substrate as the image sensing array 12 and image storing array 16. Although only one line decimating shift register is shown in connection to the image sensing array, it will be well understood that multiple line decimating shift registers may also be connected to a single image sensor.

Other embodiments of the invention, including additions, subtractions, deletions and other modifications including alternate timing schemes of the preferred disclosed embodiments of the invention will be obvious to those skilled in the art and are within the scope of the following claims.

What is claimed is:

1. A shift register for line decimating an output signal into a plurality of subsections wherein the output signal is received from a charge domain device of the type comprising an array of charge-packet creating elements, said output shift register comprising:
   a first plurality of charge-packet holding elements connected in series relation with respect to each other and connectable in relation with respect to the array of charge-packet creating elements so that each element of said first plurality of elements can store a charge packet received from a respective one of the elements of the array; and a second plurality of charge-packet holding elements divided into a select number of groups proportional to the number of charge-packet holding elements in each subsection to which the output signal is line decimated, said charge-packet holding elements of each of said groups of said second plurality of charge-packet holding elements being serially connected with respect to each other, with the charge-packet holding element at one end of each group of said serially connected second plurality of charge-packet holding elements being connected, respectively, to a select charge-packet holding element of said first plurality of charge-packet holding elements and the charge-packet holding element at the other end of each group of said serially connected second plurality of charge-packet holding elements being connected, respectively, to a select charge-packet holding element of said first plurality of charge-packet holding elements, said select charge-packet holding elements of said first plurality of charge-packet holding elements to which said end charge-packet holding elements of said second plurality of charge-packet holding elements are connected being determined by the number of line decimations imparted to the output signal.

2. The shift register of claim 1 wherein N line decimations of M charge-packet holding elements each are provided to the output signal, said register comprising M groups of said second plurality of charge-packet holding elements with at least one of said end charge-packet holding elements of each of said M groups connecting, respectively, to each $N^{th}$ charge-packet holding element of said first plurality of charge-packet holding elements.

3. The shift register of claim 2 wherein each one of said M groups of said second plurality of charge-packet holding elements comprises a carousel of at least $N-1$ charge packet holding elements.

4. The shift register of claim 3 wherein each of said charge-packet holding elements of said first and second plurality of charge-packet holding elements each includes at least three control gates for controlling the transfer of charge packets therethrough in at least three separate phases.

5. The shift register of claim 3 wherein each of said charge-packet holding elements of said first and second plurality of charge-packet holding elements includes at least two control gates for controlling the transfer of charge packets therethrough in at least two separate phases, each phase of which includes a barrier and well region.

6. The shift register of claim 3 wherein each of said charge-packet holding elements of said first and second plurality of charge-packet holding elements has a single control gate for controlling the transfer of charge packets therethrough in at least two separate phases, each phase of which includes a barrier and well region.

7. A charge domain imaging device for providing an output signal line decimated into a plurality of subsections comprising:

an array of charge-packet creating photosensitive elements comprising a semiconductor substrate and a plurality of electrodes structured with respect to each other such that control signals applied to said electrodes in a select manner operate to transfer charge packets from select photosensitive elements; and an output shift register comprising a first plurality of charge-packet holding elements connected in series with respect to each other and with respect to said array such that each element of said first plurality of elements simultaneously stores a charge packet from a respective one of said elements of said array, said output shift register also comprising a second plurality of charge-packet holding elements divided into a select number of groups proportional to the number of charge-packet holding elements in each subsection to which the output signal is line decimated, said charge-packet holding elements of each of said groups of said second plurality of charge-packet holding elements being serially connected with respect to each other, with the charge-packet holding element at one end of each group of said serially connected second plurality of charge-packet holding elements being connected, respectively, to a different select charge-packet holding element of said first plurality of charge-packet holding elements and the charge-packet holding element at the other end of each group of said serially connected second plurality of charge-packet holding elements being connected, respectively, to a select charge-packet holding element of said first plurality of charge-packet holding elements, said select charge-packet holding elements of said first plurality of charge-packet holding elements to which said end charge-packet holding elements of said second plurality of charge-packet holding elements being connected being determined as a function of the number of line decimations imparted to the output signal.

8. The device of claim 7 wherein N line decimations of M charge-packet holding elements each are provided to the output signal, said device comprising M groups of said second plurality of charge-packet holding elements with at least one of said end charge-packet holding elements of each of said M groups connecting, respectively, to each Nth charge-packet holding element of said first plurality of charge-packet holding elements.

9. The device of claim 8 wherein each one of said M groups of said second plurality of charge-packet holding elements comprises a carousel of at least $N-1$ charge-packet holding elements.

10. The device of claim 9 wherein each of said charge-packet holding elements of said first and second plurality of charge-packet holding elements each includes at least three control gates for controlling the transfer of charge packets therethrough in at least three separate phases.

11. The device of claim 9 wherein each of said charge-packet holding elements of said first and second plurality of charge-packet holding elements each includes at least two control gates for controlling the transfer of charge packets therethrough in at least two separate phases, each phase of which has a barrier and well region.

12. The device of claim 9 wherein each of said charge-packet holding elements of said first and second plurality of charge-packet holding elements, each has a single gate for controlling the transfer of charge packets therethrough in at least two separate phases, each phase of which has a barrier and well region.

13. The device of claim 7 wherein said charge-packet creating photosensitive elements are arranged in a two-dimensional array and said first plurality of charge-packet holding elements are connected in parallel relation with respect to said two-dimensional array so that each element of said first plurality of elements can receive a charge packet from a respective one of the elements of the array.

14. A process for line decimating an output signal from a charge domain device into a plurality of subsections comprising the steps of:
gating a plurality of charge packets from the charge domain device into a first plurality of charge-packet holding elements connected in serial relation with respect to each other;
gating selected groups of charge packets held in said first plurality of charge-packet holding elements in ordered sequence into respective groups of a second plurality of charge-packet holding elements, said number of groups of said second plurality of charge-packet holding elements corresponding to the number of charge-packet holding elements in each subsection to which the output signal is to be line decimated;
gating simultaneously at least one charge packet from each of said groups of said second plurality of charge-packet holding elements into said first plurality of charge-packet holding elements and thereafter gating out in ordered sequence all of said charge packets held in said first plurality of charge-packet holding elements; and
repeating the steps of the preceding paragraph until all of said charge packets are gated out of said first and second plurality of charge-packet holding elements.

15. The process of claim 14 wherein: N line decimations of M charge-packet holding elements each are provided to the output signal, M groups of charge packets held in said first plurality of charge-packet holding elements are gated in ordered sequence, respectively, into M groups of said second plurality of charge-packet holding elements starting with each $N^{th}$ charge packet.

16. The process of claim 15 further including the step of gating charge packets in ordered sequence around each of said M groups of said second plurality of charge packet holding elements, wherein each of said M groups of said second plurality of charge-packet holding elements comprises a select plurality of serially connected charge-packet holding elements arranged in a carousel.

17. The process of claim 16 wherein said gating of said charge-packet holding elements is done in one, two or more phases.

* * * * *